(12) United States Patent
Lee et al.

(10) Patent No.: US 11,099,432 B2
(45) Date of Patent: Aug. 24, 2021

(54) DISPLAY DEVICE

(71) Applicant: SAMSUNG DISPLAY CO., LTD., Yongin-si (KR)

(72) Inventors: Baekhee Lee, Yongin-si (KR); Youngmin Kim, Yongin-si (KR); Haeil Park, Yongin-si (KR); Kwangkeun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 263 days.

(21) Appl. No.: 15/791,636

(22) Filed: Oct. 24, 2017

(65) Prior Publication Data

US 2018/0120646 A1 May 3, 2018

(30) Foreign Application Priority Data

Nov. 2, 2016 (KR) ........................ 10-2016-0145110

(51) Int. Cl.
*G02F 1/13357* (2006.01)
*G02B 5/02* (2006.01)
(Continued)

(52) U.S. Cl.
CPC ..... *G02F 1/133617* (2013.01); *G02B 5/0236* (2013.01); *G02F 1/133514* (2013.01); *G02F 1/133621* (2013.01); *H01L 27/322* (2013.01); *H01L 51/5268* (2013.01); *B82Y 20/00* (2013.01); *C09K 2323/031* (2020.08); *G02F 1/133504* (2013.01); *G02F 1/133528* (2013.01);
(Continued)

(58) Field of Classification Search
CPC . B82Y 20/00; G02B 5/0236; G02F 1/133514; G02F 1/133621; G02F 1/133528; G02F 2001/133614; G02F 1/133617; Y10S 977/774; Y10S 977/813; H01L 51/5268; H01L 27/322; C09K 2323/031
See application file for complete search history.

(56) References Cited

U.S. PATENT DOCUMENTS 7,750,984 B2 7/2010 Ha et al.
8,642,991 B2 2/2014 Park et al.
(Continued)

FOREIGN PATENT DOCUMENTS

EP 3318922 B1 * 2/2020 ....... G02F 1/133514
KR 10-2010-0053409 A 5/2010
(Continued)

OTHER PUBLICATIONS

European Office action dated Jan. 23, 2019 for corresponding EP 17197170.8.
(Continued)

*Primary Examiner* — Sophie Hon
(74) *Attorney, Agent, or Firm* — Lewis Roca Rothgerber Christie LLP

(57) ABSTRACT

A display device includes a backlight, a first substrate on a path of light output from the backlight, a second substrate facing the first substrate, a light amount control layer between the first and second substrates, a color filter layer on the second substrate at a pixel area, and a light conversion layer between the light amount control layer and the color filter layer. The light conversion layer outputs white light.

25 Claims, 6 Drawing Sheets

(51) Int. Cl.
  *G02F 1/1335* (2006.01)
  *H01L 27/32* (2006.01)
  *H01L 51/52* (2006.01)
  *B82Y 20/00* (2011.01)

(52) U.S. Cl.
  CPC .. *G02F 1/133548* (2021.01); *G02F 1/133614* (2021.01); *G02F 2202/36* (2013.01); *H01L 2251/5369* (2013.01); *Y10S 977/774* (2013.01); *Y10S 977/813* (2013.01); *Y10S 977/95* (2013.01); *Y10S 977/952* (2013.01)

(56) References Cited

U.S. PATENT DOCUMENTS

| | | | |
|---|---|---|---|
| 2004/0056990 A1* | 3/2004 | Setlur | G02F 1/133617 349/69 |
| 2012/0113672 A1 | 5/2012 | Dubrow et al. | |
| 2012/0170303 A1* | 7/2012 | Meir | G02B 6/0021 362/555 |
| 2012/0287381 A1 | 11/2012 | Li et al. | |
| 2013/0010229 A1 | 1/2013 | Shin et al. | |
| 2014/0192294 A1 | 7/2014 | Chen et al. | |
| 2015/0062490 A1 | 3/2015 | Kwon | |
| 2016/0091757 A1 | 3/2016 | Miki et al. | |
| 2016/0104760 A1* | 4/2016 | Maeda | H01L 27/3279 257/40 |
| 2016/0141538 A1* | 5/2016 | Lee | H01L 51/504 257/40 |
| 2016/0195773 A1 | 7/2016 | Lee et al. | |
| 2016/0195774 A1 | 7/2016 | Lee et al. | |
| 2017/0362502 A1 | 12/2017 | Lee et al. | |

FOREIGN PATENT DOCUMENTS

| | | |
|---|---|---|
| KR | 10-2013-0083807 A | 7/2013 |
| KR | 10-2016-0084557 A | 7/2016 |
| KR | 10-2016-0084794 A | 7/2016 |
| WO | WO 2016/111483 A1 | 7/2016 |

OTHER PUBLICATIONS

Extended European Search Report dated Feb. 15, 2018 from the corresponding European Patent Application No. 17197170.8.

* cited by examiner

DISPLAY DEVICE

CROSS-REFERENCE TO RELATED APPLICATION

Korean Patent Application No. 10-2016-0145110, filed on Nov. 2, 2016, in the Korean Intellectual Property Office, and entitled: "Display Device," is incorporated by reference herein in its entirety.

BACKGROUND

1. Field

One or more embodiments described herein relate to a display device.

2. Description of the Related Art

A variety of displays have been developed. Examples include liquid crystal displays, organic light emitting diode displays, plasma display panels, electrophoretic displays, and a photo-luminescent displays (PLDs). A PLD uses a fluorescent pattern instead of a color filter to generate an image. For example, a PLD may include a blue light source, a red fluorescent material that converts blue light to red light, and a green fluorescent material that converts blue light to green light.

SUMMARY

In accordance with one embodiment, a display device includes a backlight to output light; a first substrate on a path of the light output from the backlight; a second substrate facing the first substrate; a light amount control layer between the first and second substrates; a color filter layer on the second substrate at a pixel area; and a light conversion layer between the light amount control layer and the color filter layer, wherein the light conversion layer is to output white light. The light conversion layer may include a base layer and different kinds of fluorescent materials substantially uniformly dispersed in the base layer. The fluorescent material may include at least two of a red fluorescent material, a green fluorescent material, or a blue fluorescent material.

The fluorescent material may include at least one of a quantum dot, a quantum rod, or a tetrapod quantum dot. The quantum dot has a structure may include a shell covering a core, the core includes at least one of CdSe, CdS, CdTe, ZnS, ZnSe, ZnTe, CdSeTe, CdZnS, CdSeS, PbSe, PbS, PbTe, AgInZnS, HgS, HgSe, HgTe, GaN, GaP, GaAs, InP, InZnP, InGaP, InGaN InAs, or ZnO, and the shell includes at least one of CdS, CdSe, CdTe, CdO, ZnS, ZnSe, ZnSeS, ZnTe, ZnO, InP, InS, GaP, GaN, GaO, InZnP, InGaP, InGaN, InZnSCdSe, PbS, TiO, SrSe, or HgSe.

The fluorescent material may include at least one of $Y_3Al_5O_{12}:Ce^{3+}$(YAG:Ce), $Tb_3Al_5O_{12}:Ce^{3+}$(TAG:Ce), $(Sr,Ba,Ca)_2SiO_4:Eu^{2+}$, $(Sr,Ba,Ca,Mg,Zn)_2Si(OD)_4:Eu^{2+}$ (D=F, Cl,S,N,Br), $Ba_2MgSi_2O_7:Eu^{2+}$, $Ba_2SiO_4:Eu^{2+}$, $Ca_3(Sc,Mg)_2Si3O_{12}:Ce^{3+}$, $(Ca,Sr)S:Eu^{2+}$, $(Sr,Ca)Ga_2S_4:Eu^{2+}$, $SrSi_2O_2N_2:Eu^{2+}$, $SiAlON:Ce^{3+}$, $\beta$-$SiAlON:Eu^{2+}$, Ca-$\alpha$-$SiAlON:Eu^{2+}$, $Ba_3Si_6O_{12}N_2:Eu^{2+}$, $CaAlSiN_3:Eu^{2+}$, $(Sr,Ca)AlSiN_3:Eu^{2+}$, $Sr_2Si_5N_8:Eu^{2+}$, $(Sr,Ba)Al_2O_4:Eu^{2+}$, $(Mg,Sr)Al_2O_4:Eu^{2+}$, or $BaMg_2Al_{16}O_{27}:Eu^{2+}$.

The light conversion layer may include a scattering material. The scattering material may include at least one of silica, titanium oxide ($TiO_2$), zirconium oxide ($ZrO_2$), acrylic beads, styrene-acryl beads, melamine beads, polystyrene, polymethylmethacrylate, polyurethane, polycarbonate beads, polyvinyl chloride beads, silicone-based particles, or air pores.

A particle size of the scattering material may be based on the following Equation: $\lambda/10 < PS < 2\lambda$, where $\lambda$ corresponds to a center wavelength of light to be emitted by the fluorescent material and PS corresponds to a particle size of the scattering material. The scattering material may have a diameter ranging from about 20 nm to about 1 µm.

The color filter layer may include at least two color filters of different colors. The light conversion layer may be formed integrally with said at least two color filters. The color filter layer may include a red color filter, a green color filter, and a blue color filter. The light conversion layer may have a thickness ranging from about 1 µm to about 100 µm. The backlight may output blue light. The backlight may output ultraviolet (UV) light. The display device may include a polarizer between the light amount control layer and the light conversion layer. The light conversion layer and the polarizer may be in direct contact.

In accordance with one or more other embodiments, a display device includes a first substrate; an organic light emitter on the first substrate; a light conversion layer on the organic light emitter; and a color filter layer on the light conversion layer, wherein the light conversion layer is to output white light. The organic light emitter may emit blue light. The organic light emitter may include a first electrode; a blue light emitting layer on the first electrode; and a second electrode on the blue light emitting layer.

The organic light emitter may emit white light. The organic light emitter may include a first electrode; a first light emitter on the first electrode; an electric charge generation layer on the first light emitter; a second light emitter on the electric charge generation layer; and a second electrode on the second light emitter, wherein the first light emitter includes a blue light emitting layer and the second light emitter includes a yellow light emitting layer.

The light conversion layer may include a base layer; and different kinds of fluorescent materials substantially uniformly dispersed in the base layer. The fluorescent material may include at least two of a red fluorescent material, a green fluorescent material, or a blue fluorescent material. The fluorescent material may include at least one of a quantum dot, a quantum rod, or a tetrapod quantum dot.

The quantum dot may have a structure including a shell covering a core, the core includes at least one of CdSe, CdS, CdTe, ZnS, ZnSe, ZnTe, CdSeTe, CdZnS, CdSeS, PbSe, PbS, PbTe, AgInZnS, HgS, HgSe, HgTe, GaN, GaP, GaAs, InP, InZnP, InGaP, InGaN, InAs, or ZnO, and the shell includes at least one of CdS, CdSe, CdTe, CdO, ZnS, ZnSe, ZnSeS, ZnTe, ZnO, InP, InS, GaP, GaN, GaO, InZnP, InGaP, InGaN, InZnSCdSe, PbS, TiO, SrSe, or HgSe.

The fluorescent material includes at least one of $Y_3Al_5O_{12}:Ce^{3+}$(YAG:Ce), $Tb_3Al_5O_{12}:Ce^{3+}$(TAG:Ce), $(Sr,Ba,Ca)_2SiO_4:Eu^{2+}$, $(Sr,Ba,Ca,Mg,Zn)_2Si(OD)_4:Eu^{2+}$ (D=F, Cl,S,N,Br), $Ba_2MgSi_2O_7:Eu^{2+}$, $Ba_2SiO_4:Eu^{2+}$, $Ca_3(Sc,Mg)_2Si3O_{12}:Ce^{3+}$, $(Ca,Sr)S:Eu^{2+}$, $(Sr,Ca)Ga_2S_4:Eu^{2+}$, $SrSi_2O_2N_2:Eu^{2+}$, $SiAlON:Ce^{3+}$, $\beta$-$SiAlON:Eu^{2+}$, Ca-$\alpha$-$SiAlON:Eu^{2+}$, $Ba_3Si_6O_{12}N_2:Eu^{2+}$, $CaAlSiN_3:Eu^{2+}$, $(Sr,Ca)AlSiN_3:Eu^{2+}$, $Sr_2Si_5N_8:Eu^{2+}$, $(Sr,Ba)Al_2O_4:Eu^{2+}$, $(Mg,Sr)Al_2O_4:Eu^{2+}$, or $BaMg_2Al_{16}O_{27}:EU^{2+}$.

The light conversion layer may include a scattering material. The scattering material may include at least one of silica, titanium oxide ($TiO_2$), zirconium oxide ($ZrO_2$), acrylic beads, styrene-acryl beads, melamine beads, polystyrene, polymethylmethacrylate, polyurethane, polycarbonate beads, polyvinyl chloride beads, silicone-based particles, or air pores. The color filter layer may include at least two color filters of different colors. The light conversion layer may be formed integrally with said at least two color filters.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
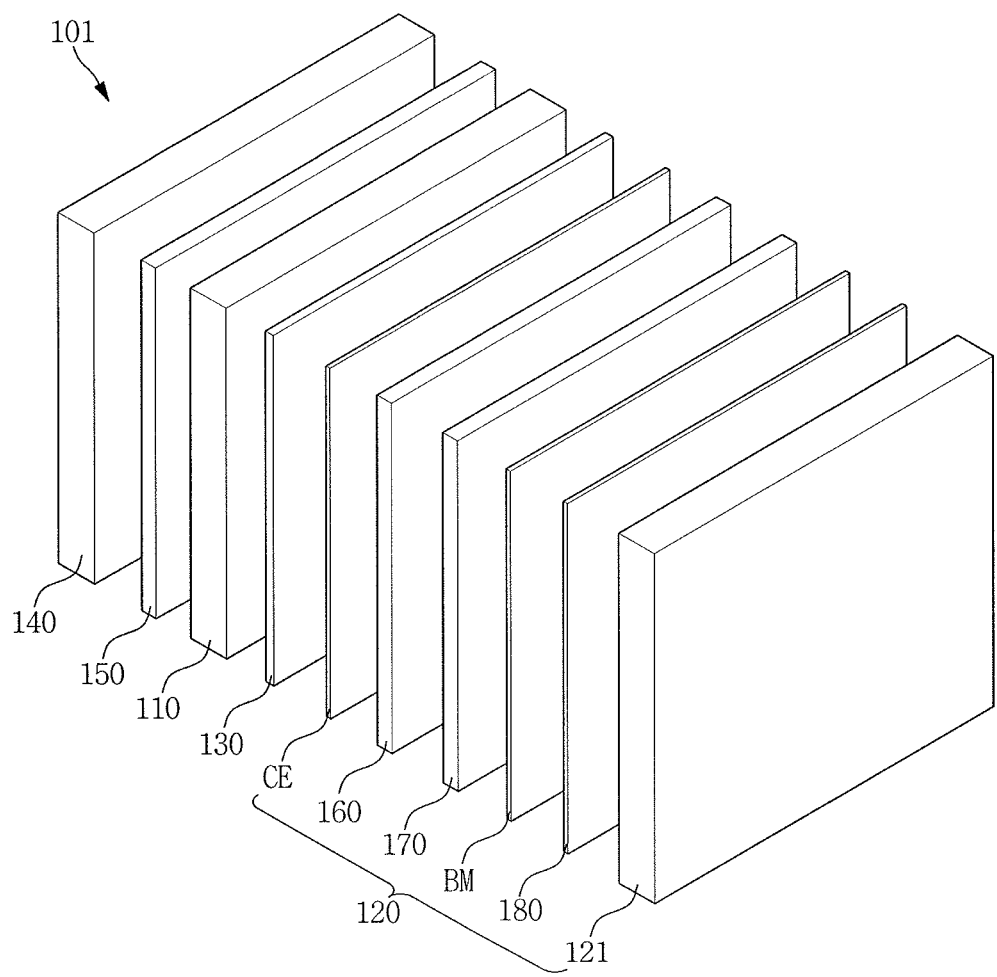
FIG. 1 illustrates an embodiment of a display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a display device 101 which includes a backlight unit 140, a first polarization member (first polarizer) 150, a display substrate 110, a light amount control layer 130, and an opposing substrate 120. The opposing substrate 120 may include a common electrode CE, a second polarization member 160, a light conversion layer 170, a black matrix BM, a color filter layer 180, and a second substrate 121.

The backlight unit 140 may emit ultraviolet (UV) rays, near (UV) rays, or light in another wavelength range. The backlight unit 140 may irradiate, for example, white light or blue light to the display substrate 110. In one embodiment, a display device including a backlight unit 140 that emits blue light discussed.

The backlight unit 140 may include a light source and a light guide plate. For example, the backlight unit 140 may include a plurality of light sources below the display substrate 110. The display substrate 110, the light amount control layer 130, and the opposing substrate 120 are on a path of light output from the backlight unit 140.

The light amount control layer 130 may include a layer to control transmittance of light output from the backlight unit 140. For example, the light amount control layer 130 may be a liquid crystal layer, an electro-wetting layer, or an electrophoresis layer. A light amount control layer 130 in the form of a liquid crystal layer will be discussed by way of example. In such an exemplary embodiment, the display device 101 may be referred to as a liquid crystal display (LCD) device.

The first polarization member 150 is on the display substrate 110. For example, the first polarization member 150 may be between the backlight unit 140 and the light amount control layer 130. The first polarization member 150 is on a rear surface of the display substrate 110. A surface of the display substrate 110 on the side of the backlight unit 140 may be referred to as the rear surface of the display substrate 110.

Figure 2:
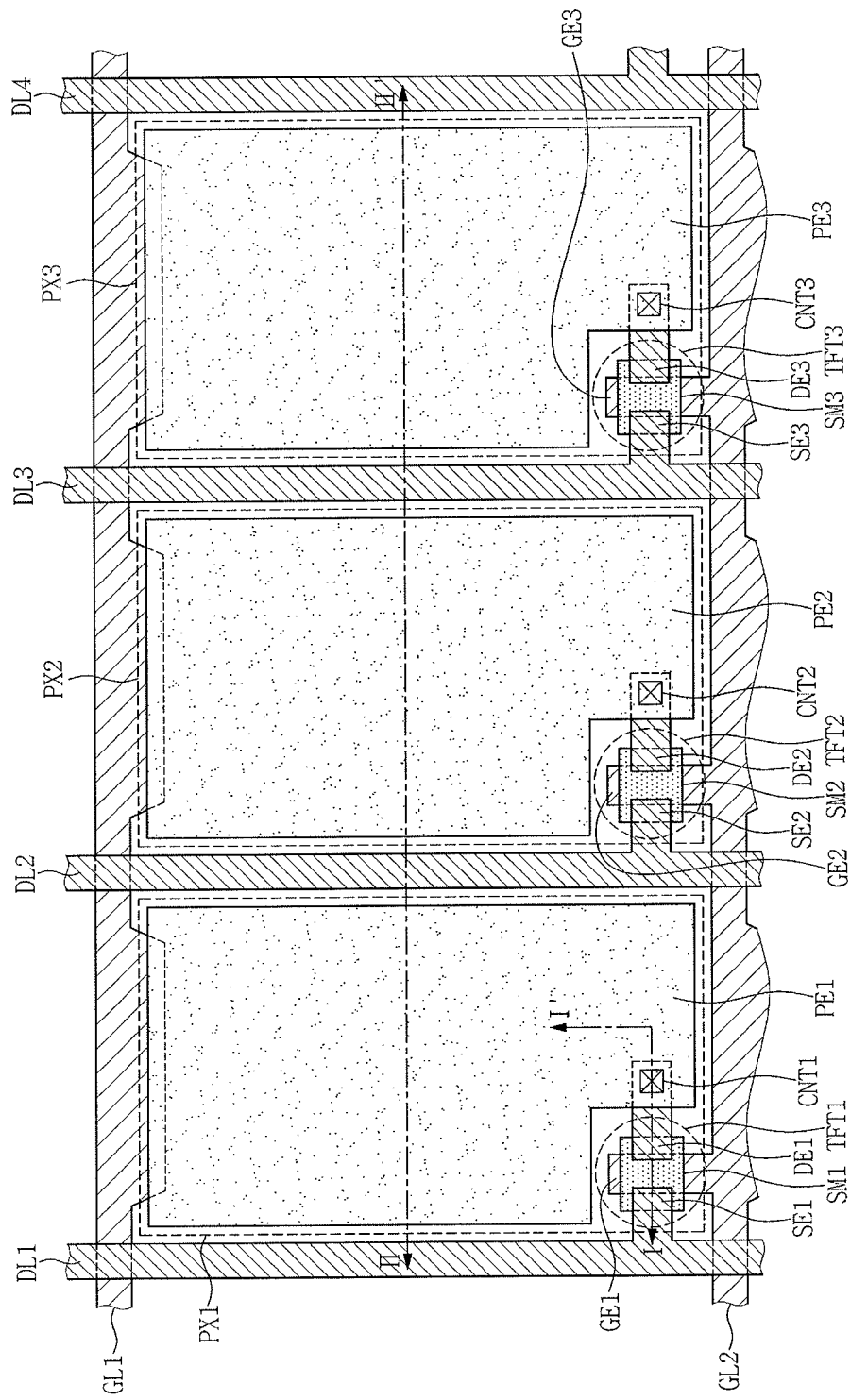
FIG. 2 illustrates another embodiment of a display device.
Figure 3:
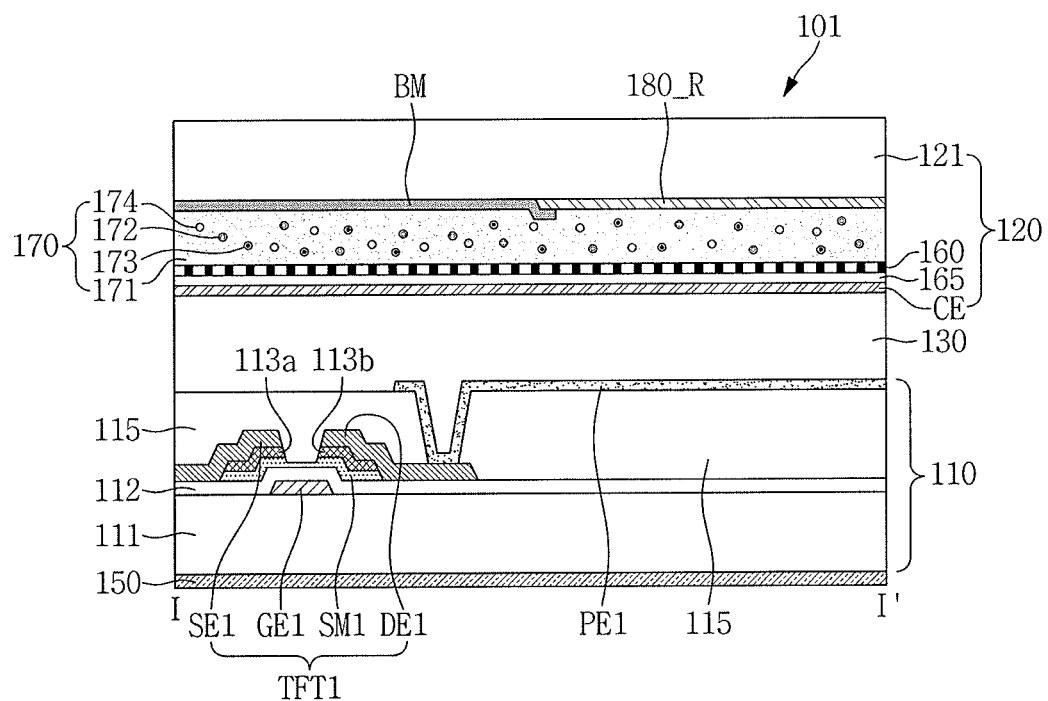
FIG. 3 illustrates a cross-sectional view along line I-I' in FIG. 2.
Figure 4:
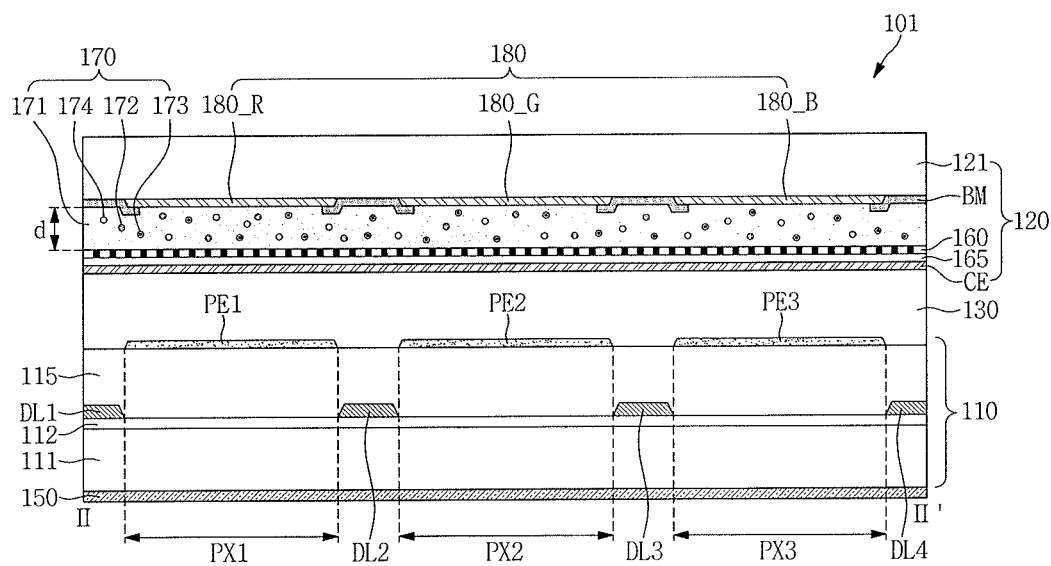
FIG. 4 illustrates a cross-sectional view along line II-II' in FIG. 2.

FIG. 2 illustrates an embodiment of a display device, which, for example, may correspond to display device 101. FIG. 3 illustrates a cross-sectional view along line I-I' in FIG. 2. FIG. 4 illustrates a cross-sectional view along line II-II' in FIG. 2.

Referring to FIGS. 2, 3, and 4, the display device 101 may include the display substrate 110, the opposing substrate 120, the light amount control layer 130, the first polarization member 150. The display substrate 110 may include a first substrate 111, thin film transistors TFT1, TFT2, and TFT3, pixel electrodes PE1, PE2, and PE3, a gate insulating layer 112, and a protective layer 115. The opposing substrate 120 may include the common electrode CE, the insulating layer 165, the second polarization member (second polarizer) 160, the light conversion layer 170, the black matrix BM, the color filter layer 180, and the second substrate 121.

The first substrate 111 includes transparent glass or plastic.

The thin film transistors TFT1, TFT2, and TFT3 include semiconductor layers SM1, SM2 and SM3, gate electrodes GE1, GE2, and GE3, source electrodes SE1, SE2 and SE3, and drain electrodes DE1, DE2, and DE3, respectively. The gate electrodes GE1, GE2, and GE3 are formed integrally with gate lines GL1 and GL2. The gate electrodes GE1, GE2, and GE3 are on the first substrate 111. The gate lines GL1 and GL2 and the gate electrodes GE1, GE2, and GE3 may include or be formed of at least one of aluminum (Al) or alloys thereof, silver (Ag) or alloys thereof, copper (Cu) or alloys thereof, molybdenum (Mo) or alloys thereof, chromium (Cr), tantalum (Ta), and/or titanium (Ti).

The gate lines GL1 and GL2 and the gate electrodes GE1, GE2, and GE3 may have a multilayer structure including at least two conductive layers having different physical properties. For example, a conductive layer of the multilayer structure may include or be formed of a metal (e.g., an aluminum (Al)-based metal, a silver (Ag)-based metal, or a copper (Cu)-based metal) having low resistivity to reduce signal delay or voltage drop. Another conductive layer of the multilayer structure may include a material (e.g., a molybdenum-based metal, chromium, titanium, or tantalum) having excellent contact properties with indium tin oxide (ITO) and indium zinc oxide (IZO).

Examples of the multilayer structure may include but are not limited to a chromium lower layer and an aluminum upper layer, an aluminum lower layer and a molybdenum upper layer, and a titanium lower layer and a copper upper layer. The gate lines GL1 and GL2 and the gate electrodes GE1, GE2, and GE3 may include various metals and conductors. The gate lines GL1 and GL2 and the gate electrodes GE1, GE2, and GE3 may be simultaneously formed in a substantially same process.

The gate insulating layer 112 is over an entire surface of the first substrate 111 including the gate lines GL1 and GL2 and the gate electrodes GE1, GE2, and GE3. The gate insulating layer 112 may include silicon nitride (SiNx), silicon oxide (SiOx), or another material. In one embodiment, gate insulating layer 112 may have a multilayer structure including at least two insulating layers of different physical properties.

The semiconductor layers SM1, SM2, and SM3 are on the gate insulating layer 112. In such an exemplary embodiment, the semiconductor layers SM1, SM2, and SM3 overlap the gate electrodes GE1, GE2, and GE3 below the gate insulating layer 112. The semiconductor layers SM1, SM2, and SM3 may include amorphous silicon, polycrystalline silicon, or another material.

First and second ohmic contact layers 113a and 113b may be on the semiconductor layers SM1, SM2, and SM3. For example, the first and second ohmic contact layers 113a and 113b may be on the semiconductor layers SM1, SM2, and SM3 corresponding to areas except for channel areas of the semiconductor layers SM1, SM2, and SM3. The first ohmic contact layer 113a is separated from the second ohmic contact layer 113b. Each of the first and second ohmic contact layers 113a and 113b may include silicide or n+ hydrogenated amorphous silicon doped with n-type impurities, e.g., phosphorus (P), at high concentration.

The source electrodes SE1, SE2, and SE3 are formed integrally with data lines DL1, DL2, and DL3. The source electrodes SE1, SE2, and SE3 are on the first ohmic contact layer 113a. The drain electrodes DE1, DE2, and DE3 are on the second ohmic contact layer 113b. The drain electrodes DE1, DE2, and DE3 are connected to the pixel electrodes PE1, PE2, and PE3.

At least one of the data lines DL1, DL2, DL3, and DL4, the source electrodes SE1, SE2, and SE3 and the drain electrodes DE1, DE2, and DE3 may include or be formed of a refractory metal, such as molybdenum, chromium, tantalum and titanium, or an alloy thereof. In one embodiment, at least one of the data lines DL1, DL2, DL3, and DL4, the source electrodes SE1, SE2, and SE3 and the drain electrodes DE1, DE2, and DE3 may have a multilayer structure including a refractory metal layer and a low-resistance conductive layer. Examples of the multilayer structure may include a double-layer structure including a chromium or molybdenum (alloy) lower layer and an aluminum (alloy) upper layer, and a triple-layer structure including a molybdenum (alloy) lower layer, an aluminum (alloy) intermediate layer, and a molybdenum (alloy) upper layer. In one embodiment, at least one of the data lines DL1, DL2, DL3, and DL4, the source electrodes SE1, SE2, and SE3, or the drain electrodes DE1, DE2, and DE3 may include or be formed of various kinds of metals or conductors rather than the aforementioned materials.

The protective layer 115 is over an entire surface of the first substrate 111 including the data lines DL1, DL2, DL3, and DL4, the source electrodes SE1, SE2, and SE3, and the drain electrodes DE1, DE2, and DE3. The protective layer 115 may include an inorganic insulating material such as silicon nitride (SiNx) or silicon oxide (SiOx). In one embodiment, the protective layer 115 may include an inorganic insulating material. In such an exemplary embodiment, an inorganic insulating material having photosensitivity and a dielectric constant of about 4.0 may be used. The protective layer 115 may have a double-layer structure including a lower inorganic layer and an upper organic layer to substantially prevent an exposed portion of the semiconductor layers SM1, SM2, and SM3 from being damaged, while at the same time having excellent insulating properties of the organic layer. The protective layer 115 may have a thickness greater than or equal to about 5000 Å, e.g., in the range of about 6000 Å to about 8000 Å.

The pixel electrodes PE1, PE2, and PE3 are on the protective layer 115. In such an exemplary embodiment, the pixel electrodes PE1, PE2, and PE3 are connected to the drain electrodes DE1, DE2, and DE3 through contact holes CNT1, CNT2, and CNT3 of the protective layer 115, respectively. The pixel electrodes PE1, PE2, and PE3 may include or be formed of a transparent conductive material, e.g., indium tin oxide (ITO) or indium zinc oxide (IZO). In such an exemplary embodiment, ITO may be a polycrystalline or monocrystalline material, and IZO may be a polycrystalline or monocrystalline material as well.

The opposing substrate 120 may include the common electrode CE, the insulating layer 165, the second polarization member 160, the light conversion layer 170, the black matrix BM, the color filter layer 180, and the second substrate 121.

The second substrate 121 includes transparent glass or plastic.

The color filter layer 180 may be on the second substrate 121. The color filter layer 180 may include a red color filter 180_R, a green color filter 180_G, and a blue color filter 180_B. The color filter layer 180 may be formed, for example, to a thickness ranging from about 1 μm to about 5 μm.

The red color filter 180_R includes a red pigment or dye, the green color filter 180_G includes a green pigment or dye, and the blue color filter 180_B includes a blue pigment or dye. The red pigment, the green pigment, and the blue pigment may include various pigments for forming color filters. For example, the red pigment may use a pigment of C.I. pigment red, the green pigment may use a pigment of C.I. pigment green, and the blue pigment may use a phthalocyanine pigment or an indanthrone blue pigment.

The black matrix BM may be on the color filter layer 180. In one embodiment, the color filter layer 180 may be disposed after the black matrix BM on the second substrate 121. The black matrix BM defines an aperture area through which light is transmitted. The black matrix BM may include a metal such as chromium oxide (CrOx) or an opaque organic layer material.

The light conversion layer 170 may be over an entire surface of the second substrate 121 on which the black matrix BM is disposed. The light conversion layer 170 may include a base layer 171, different kinds of fluorescent materials 172 and 173 dispersed in the base layer 171, and a scattering element 174. The base layer 171 may include a transparent resin, e.g., a silicone resin, an epoxy resin, or the like.

Each of the fluorescent materials 172 and 173 converts a wavelength of light to output light of a specific wavelength. The wavelength of the output light varies depending on the size of the fluorescent materials 172 and 173. For example, light having different wavelengths may be output based on diameters of the fluorescent materials 172 and 173.

The fluorescent materials 172 and 173 may have a diameter of about 2 nm or more and about 13 nm or less. When the fluorescent materials 172 and 173 have a small diameter (e.g., less than a predetermined value), the wavelength of the output light is shortened and blue-based light is output. When the size of a quantum dot increases, the wavelength of the output light is lengthened and red-based light is output. For example, a quantum dot particle having a diameter of about 10 nm may output red light, a quantum dot particle having a diameter of about 7 nm may output green light, and a quantum dot particle having a diameter of about 5 nm may output blue light. A fluorescent material outputting red light is referred to as a red fluorescent material. A fluorescent material outputting green light is referred to as a green fluorescent material. A fluorescent material outputting blue light is referred to as a blue fluorescent material.

The fluorescent materials 172 and 173 may include at least two of the red fluorescent material, the green fluorescent material, or the blue fluorescent material. The display device 101 according to the present embodiment is described in the illustrative case that includes red fluorescent material and green fluorescent material.

The fluorescent materials 172 and 173 may include at least one of a quantum dot, a quantum rod, or a tetrapod quantum dot.

A quantum dot may generate an intense fluorescent light because it has a high quantum yield and a high extinction coefficient compared to other fluorescent dyes. For example, a quantum dot may absorb light of a short wavelength to output light of a longer wavelength. The quantum dot may have a structure including, for example, a core nanocrystal and a shell nanocrystal surrounding the core nanocrystals. A quantum dot may include an organic ligand bonded to the shell nanocrystal and may further include an organic coating layer surrounding the shell nanocrystal. The shell nanocrystal may have two or more layers. The shell nanocrystal is on a surface of the core nanocrystal.

The quantum dot may include at least one substance of Group II compound semiconductors, Group III compound semiconductors, Group V compound semiconductors, and Group VI compound semiconductors. For example, the core nanocrystal forming the quantum dot particle may include at least one of: CdSe, CdS, CdTe, ZnS, ZnSe, ZnTe, CdSeTe, CdZnS, CdSeS, PbSe, PbS, PbTe, AgInZnS, HgS, HgSe, HgTe, GaN, GaP, GaAs, InP, InZnP, InGaP, InGaN, InAs, or ZnO. The shell nanocrystal may include at least one of: CdS, CdSe, CdTe, CdO, ZnS, ZnSe, ZNSeS, ZnTe, ZnO, InP, InS, GaP, GaN, GaO, InZnP, InGaP, InGaN, InZnSCdSe, PbS, TiO, SrSe, or HgSe.

For example, when the core nanocrystal includes CdSe, blue light may be emitted when a diameter of the quantum dot particle is in a range of about 1 nm to about 3 nm, green light may be emitted when the diameter of the quantum dot particle is in a range of about 3 nm to about 5 nm, and red light may be emitted when the diameter of the quantum dot particle is in a range of about 7 nm to about 10 nm.

The green fluorescent material may output a light having a wavelength ranging from about 500 nm to about 580 nm. The green fluorescent material may include or be formed of at least one of a zinc silicon oxide-based fluorescent material doped with manganese (e.g., $Zn_2SiO_4:Mn$), a strontium gallium sulfide-based fluorescent material doped with europium (e.g., $SrGa_2S_4:Eu$), or a barium silicon oxide chloride-based fluorescent material doped with europium (e.g., $Ba_5Si_2O_7Cl_4:Eu$). The green fluorescent material may include or be formed of at least one of $YBO_3:Ce,Tb$, $BaMgAl_{10}O_{17}:Eu,Mn$, $(Sr,Ca,Ba)(Al,Ga)_2S_4:Eu$, $ZnS:Cu,Al$ $Ca_8Mg(SiO_4)_4Cl_2:Eu,Mn$, $Ba_2SiO_4:Eu$, $(Ba, Sr)_2SiO_4:Eu$, $Ba_2(Mg,Zn)Si_2O_7:Eu$, $(Ba, Sr)Al_2O_4:Eu$, $Sr_2Si_3O_8 \cdot 2SrCl_2:Eu$, $(Sr,Ca,Ba,Mg)P_2O_7N_8:Eu,Mn$, $(Sr,Ca,Ba,Mg)_3P_2O_8:Eu,Mn$, $Ca_3Sc_2Si_3O_{12}:Ce$, $CaSc_2O_4:Ce$, $b-SiAlON:Eu$, $Ln_2Si_3O_3N_4:Tb$, or $(Sr,Ca,Ba)Si_2O_2N_2:Eu$.

The red fluorescent material may output a light having a wavelength ranging from about 580 nm to about 670 nm. The red fluorescent material may include at least one of a nitride-based red fluorescent material, a fluoride-based red fluorescent material, a silicate-based red fluorescent material, a sulfide-based red fluorescent material, a selenide-based red fluorescent material, an oxynitride-based red fluorescent material, a molybdate-based red fluorescent material, a tantalate-based red fluorescent material, carbido-nitride, a tungstate-based red fluorescent material, $Sr_2MgAl_{22}O_{36}:Mn^{4+}$, $(Ba,Sr,Ca)_2MgAl_{16}O_{27}:Eu^{2+}$, $(Ba,Sr,Ca)_2MgAl_{16}O_{27}:Mn^{2+}$, $Sr_4Al_{14}O_{460}:Eu^{2+}$, or $Mg_4O_{5.5}GeF:Mn^{4+}$.

The nitride-based red fluorescent material may include at least one of $(Sr, Ca)AlSiN_3:Eu$, $(Sr, Ca)AlSi(ON)_3:Eu$, $(Sr, Ca)_2Si_5N_8:Eu$, $(Sr, Ca)_2Si_5(ON)_8:Eu$, $(Sr, Ba)SiAl_4N_7:Eu$, $CaAlSiN3:Eu2+$, $(Sr,Ca)AlSiN3:Eu2+$, and $Sr2Si5N8:Eu2$.

The fluoride-based red fluorescent material may include at least one of $K2SiF6:Mn^{4+}$, $K2TiF6:Mn^{4+}$, $ZnSiF6:Mn^{4+}$, $Na2SiF6:Mn^{4+}$ and $Mg4O5.5GeF:Mn^{4+}$.

The molybdate-based red fluorescent material may include at least one of $LiLa1-xEuxMo_2O_8$ and $LiEuMo_2O_8$. The tantalate-based red fluorescent material may include $K(Gd,Lu,Y)Ta_2O_7:Eu^{3+}$.

The carbido-nitrides may include $Cs(Y,La,Gd)Si(CN_2)_4:Eu$.

The tungstate-based red fluorescent material may include at least one of $Gd2WO6:Eu^{3+}$, $Gd2W2O9:Eu^{3+}$, $(Gd,La)2W3O12:Eu^{3+}$, $La2W3O12:Eu^{3+}$, $La2W3O12:Sm^{3+}$, or $LiLaW2O8:Eu^{3+}$.

The scattering element 174 may include at least one of silica, titanium oxide (TiO2), zirconium oxide (ZrO2), acrylic beads, styrene-acryl beads, melamine beads, polystyrene, polymethylmethacrylate, polyurethane, polycarbonate beads, polyvinyl chloride beads, silicone-based particles, or air pores. The scattering element 174 may have, for example, a hollow shape.

When a center wavelength of the light emitted by the fluorescent materials 172 and 173 is denoted as λ and a particle size of the scattering element 174 is denoted as PS, the particle size PS of the scattering element 174 may satisfy Equation 1.

$$\lambda/10 < PS < 2\lambda \quad (1)$$

The scattering element 174 may have a diameter ranging, for example, from about 20 nm to about 1 μm.

The red fluorescent material absorbs blue light to output red light, the green fluorescent material absorbs blue light to output green light, and the scattering element 174 may output blue light. For example, the light conversion layer 170, which may be provided over an entire surface of the substrate without any additional patterning, may output white light.

In one embodiment, when the backlight unit 140 outputs UV light, the light conversion layer 170 may include a red fluorescent material, a green fluorescent material, and a blue fluorescent material to output white light.

In one embodiment, when the backlight unit 140 outputs red light, the light conversion layer 170 may include a green fluorescent material and a blue fluorescent material to output white light.

In one embodiment, when the backlight unit 140 outputs green light, the light conversion layer 170 may include a red fluorescent material and a blue fluorescent material to output white light.

The light conversion layer 170 may be formed to a thickness d ranging, for example, from about 1 µm to about 100 µm. The light conversion layer 170 may be over an entire surface of the substrate to a predetermined thickness or more without additional patterning and may also serve as a planarization layer.

The second polarization member 160 may be on the light conversion layer 170. Since the light conversion layer 170 may also serve as a planarization layer, the second polarization member 160 may be directly on the light conversion layer 170 without a separate planarization layer.

The second polarization member 160 may include a polarizer. The polarizer may include a plurality of line patterns. Each line pattern has a straight line shape extending in one direction, has a predetermined width, and is spaced apart from one another at a predetermined interval. The line pattern may include a metal. The polarizer including the plurality of metal line patterns may be referred to as a wire grid polarizer (WGP). The polarizer according to the first exemplary embodiment is a WGP. The line pattern may include at least one of, for example, aluminum (Al), gold (Au), silver (Ag), copper (Cu), chromium (Cr), iron (Fe), or nickel (Ni).

The polarizer may be formed by methods such as an imprinting method using a mold or a photolithography method. In one embodiment, the polarizer may be formed using a block copolymer.

The insulating layer 165 may be on the second polarization member 160 and the common electrode CE may be on the insulating layer 165. The common electrode CE may be a whole plate electrode including a transparent conductor such as indium tin oxide (ITO) or indium zinc oxide (IZO). In one embodiment, common electrode CE may have a concave-convex shape to define a plurality of domains and at least one slit.

An alignment layer may be further disposed between the pixel electrodes PE1, PE2, and PE3 and the light amount control layer 130 and between the light amount control layer 130 and the common electrode CE.

Figure 5:
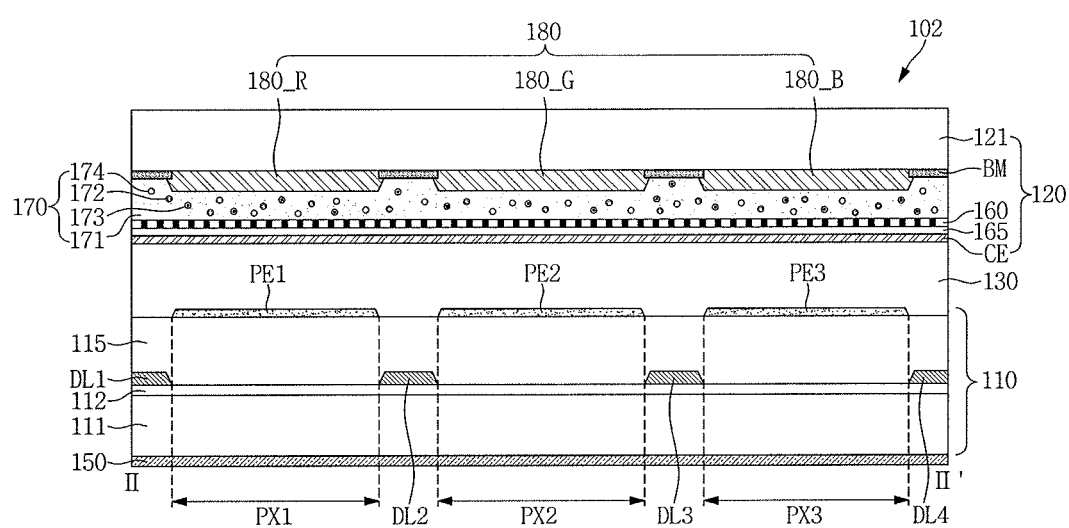
FIG. 5 illustrates another embodiment of a display device.

FIG. 5 is a cross-sectional view of another embodiment of a display device 102. After a black matrix BM is formed on a second substrate 121, a color filter layer 180 is formed on the second substrate 121 on which the black matrix BM is formed. Subsequently, a light conversion layer 170, a second polarization member 160, an insulating layer 165, a common electrode CE, and the like, may be sequentially arranged on the color filter layer 180. In addition, an alignment layer may be further disposed between pixel electrodes PE1, PE2, and PE3 and a light amount control layer 130 and between the light amount control layer 130 and the common electrode CE.

Figure 6:
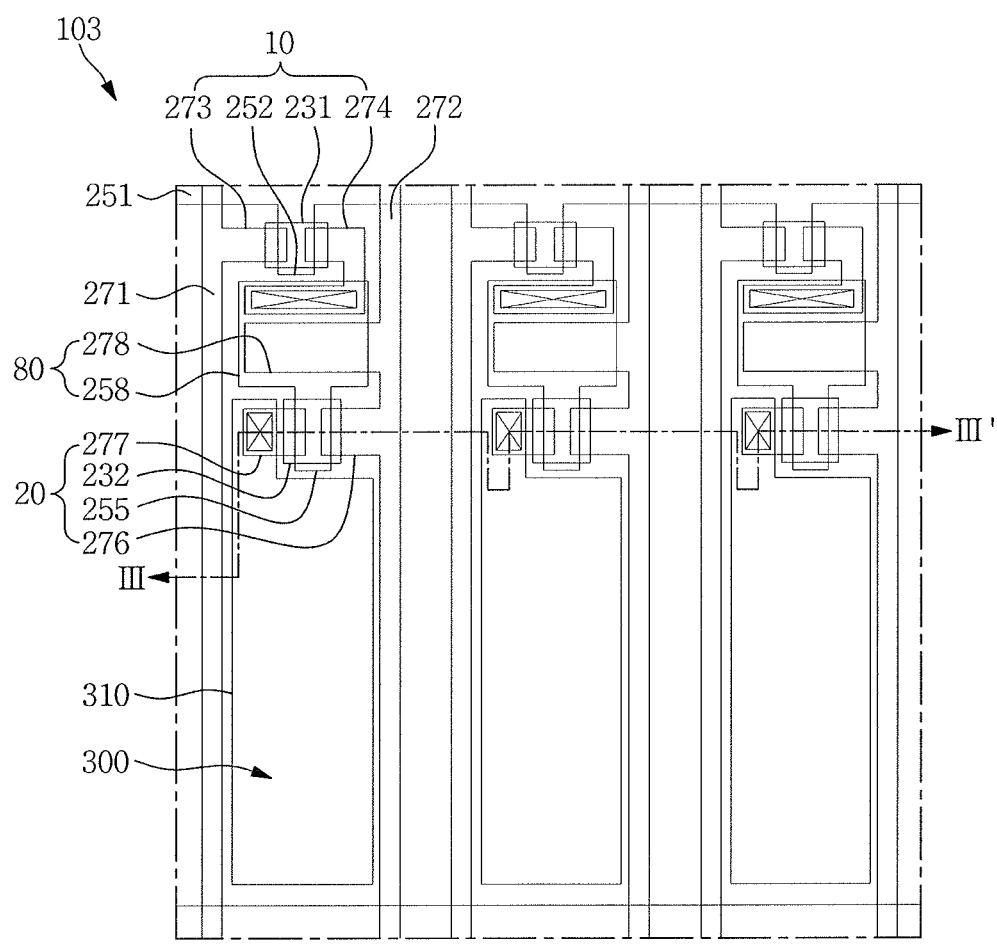
FIG. 6 illustrates another embodiment of a display device.
Figure 7:
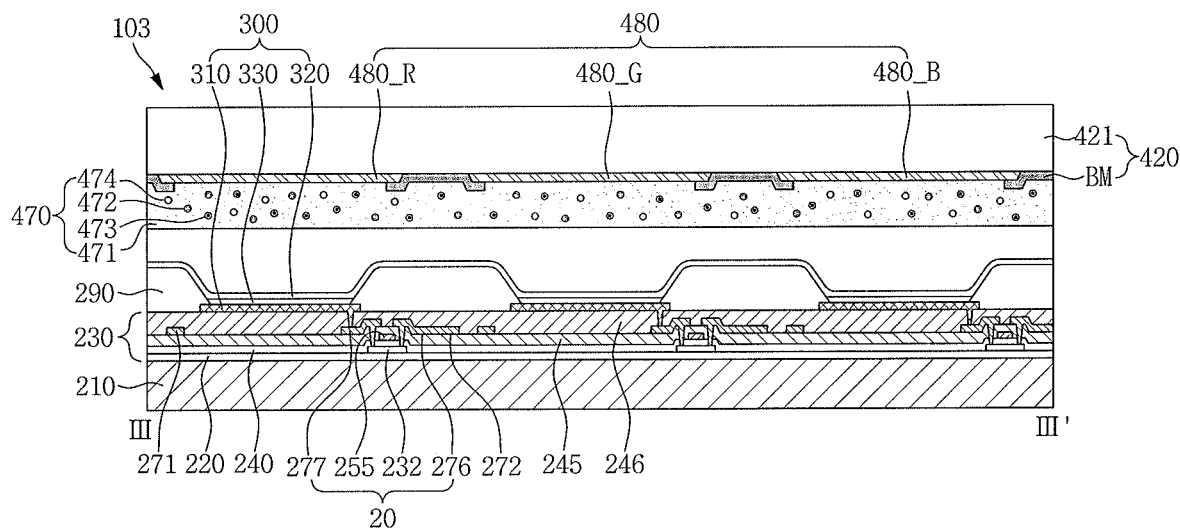
FIG. 7 illustrates a cross-sectional view along line III-III' in FIG. 6.

FIG. 6 illustrates a plan view of another embodiment of a display device 103. FIG. 7 illustrates a cross-sectional view along line of FIG. 6.

Referring to FIGS. 6 and 7, the display device 103 includes a first substrate 210, an organic light emitting element 300 on the first substrate 210, a light conversion layer 470 on the organic light emitting element 300, and a color filter layer 480 on the light conversion layer 470. The second substrate 210 may include an insulating material, e.g., glass, quartz, ceramic, or plastic.

A buffer layer 220 is on the substrate 210 and may include one or more inorganic layers and/or organic layers. The buffer layer 220 serves to substantially prevent unnecessary substances such as impurities or moisture from permeating into a wiring unit 230 or the organic light emitting element 300 and to planarize a surface therebelow. In one embodiment, the buffer layer 220 may be omitted.

The wiring unit 230 is on the buffer layer 220. The wiring unit 230 refers to a part including a switching thin film transistor (hereinafter, "TFT") 10, a driving TFT 20, and a capacitor 80 and drives the organic light emitting element 300. The organic light emitting element 300 emits light according to a driving signal applied from the wiring unit 230 to display an image.

The display device 103 may be, for example, an active matrix-type organic light emitting diode (AMOLED) display device having a 2Tr-1Cap structure. The 2Tr-1Cap structure may include two TFTs (e.g., the switching TFT 10 and the driving TFT 20) and one capacitor 80 in each pixel. In one embodiment, the display device 103 may include three or more TFTs and two or more capacitors in each pixel and may further include additional wirings.

Each pixel PX includes the switching TFT 10, the driving TFT 20, the capacitor 80, and the organic light emitting element 300. A gate line 251 extending along one direction, and a data line 271 and a common power line 272 insulated from and intersecting the gate line 251, are also provided at the wiring unit 230.

Each pixel PX may be defined by the gate line 251, the data line 271, and the common power line 272 as a boundary. The pixels PX may be defined by a pixel defining layer 290 or a black matrix.

The capacitor 80 includes a pair of capacitor plates 258 and 278, with an insulating interlayer 245 interposed therebetween. In such an exemplary embodiment, the insulating interlayer 245 may include a dielectric material. A capacitance of the capacitor 80 is determined by electric charges accumulated in the capacitor 80 and a voltage across the pair of capacitor plates 258 and 278.

The switching TFT 10 includes a switching semiconductor layer 231, a switching gate electrode 252, a switching source electrode 273, and a switching drain electrode 274. The driving TFT 20 includes a driving semiconductor layer 232, a driving gate electrode 255, a driving source electrode 276, and a driving drain electrode 277. A gate insulating layer 240 is further provided to insulate the semiconductor layers 231 and 232 and the gate electrodes 252 and 255.

The switching TFT 10 may function as a switching element which selects a pixel to perform light emission. The switching gate electrode 252 is connected to the gate line 251, and the switching source electrode 273 is connected to the data line 271. The switching drain electrode 274 is spaced apart from the switching source electrode 273 and is connected to one of the capacitor plates, e.g., the capacitor plate 258.

The driving TFT 20 applies a driving power, which allows the organic light emitting element 300 in a selected pixel to emit light, to a first electrode 310 which is a pixel electrode PE. The driving gate electrode 255 is connected to capacitor plate 258 that is connected to the switching drain electrode 274. Each of the driving source electrode 276 and the other of the capacitor plates (e.g., the capacitor plate 278) is connected to the common power line 272. The driving drain electrode 277 is connected to the first electrode 310 of organic light emitting element 300 through a contact hole.

With the above-described structure, the switching TFT 10 is operated based on a gate voltage applied to the gate line 251 and serves to transmit a data voltage applied to the data line 271 to the driving TFT 20. A voltage equivalent to a difference between a common voltage applied to the driving TFT 20 from the common power line 272 and the data voltage transmitted by (or from) the switching TFT 10 is stored in the capacitor 80. Current corresponding to the voltage stored in the capacitor 80 flows to the organic light emitting element 300 through the driving TFT 20 to cause the organic light emitting element 300 to emit light.

A protective layer 246 is on the insulating interlayer 245 and includes an insulating material to protect the wiring unit 230. The protective layer 246 and the insulating interlayer 245 may include a substantially same material.

The organic light emitting element 300 in the display device 103 may be an organic light emitting element that emits blue light. The organic light emitting element 300 may include the first electrode 310, a blue light emitting layer 330 on the first electrode 310, and a second electrode 320 on the blue light emitting layer 330.

The pixel defining layer 290 is on the first electrode 310 and has an opening exposing a portion of the first electrode 310. The blue light emitting layer 330 is on the first electrode 310 exposed by the pixel defining layer 290. The first electrode 310 is a reflective electrode and the second electrode 320 is a transflective electrode. Accordingly, light generated in the blue light emitting layer 330 is output through the second electrode 320.

At least one metal of magnesium (Mg), silver (Ag), gold (Au), calcium (Ca), lithium (Li), chromium (Cr), or aluminum (Al), or an alloy thereof, may be used to form a reflective electrode or a transflective electrode. The transflective electrode has a thickness of, for example, about 200 nm or less. The transmittance of light increases as the thickness of the transflective electrode decreases. The transmittance of light decreases as the thickness of the transflective electrode increases.

The first electrode 310 may include, for example, a reflective layer including at least one metal of magnesium (Mg), silver (Ag), gold (Au), calcium (Ca), lithium (Li), chromium (Cr), copper (Cu), or aluminum (Al), and a transparent conductive layer on the reflective layer. The transparent conductive layer may be, for example, an oxide layer. The first electrode 310 may have, for example, a triple layer structure of ITO/AG/ITO.

The second electrode 320 may include a transflective layer including at least one metal of magnesium (Mg), silver (Ag), gold (Au), calcium (Ca), lithium (Li), chromium (Cr), copper (Cu), ytterbium (Yb), or aluminum (Al).

A capping layer may be on the second electrode 320 to protect the organic light emitting element 300. A thin film encapsulation layer may be on the second electrode 320 to protect the organic light emitting element 300. The thin film encapsulation layer has a structure in which at least one organic layer and at least one inorganic layer are alternately arranged, in order to substantially prevent outside air such as moisture or oxygen from permeating into the organic light emitting element 300.

The light conversion layer 470 may be on the organic light emitting element 300 and may be over an entire surface of the first substrate 210 on which the organic light emitting element 300 is disposed.

The light conversion layer 470 may include a base layer 471, different kinds of fluorescent materials 472 and 473 dispersed in the base layer 471, and a scattering element 474.

The base layer 471 may include a transparent resin, e.g., a silicone resin, an epoxy resin, or another material.

The fluorescent materials 472 and 473 convert a wavelength of light to output light of a specific wavelength. The wavelength of the output light varies depending on the size of the fluorescent materials 472 and 473. For example, light of different wavelengths may be output based on diameters of the fluorescent materials 472 and 473. The fluorescent materials 472 and 473 may have a diameter of, for example, about 2 nm or more and about 10 nm or less. The fluorescent materials 472 and 473 may include at least two of a red fluorescent material, a green fluorescent material, or a blue fluorescent material. The display device 103 of the present embodiment illustratively includes a red fluorescent material and a green fluorescent material.

The fluorescent materials 472 and 473 may include at least one of a quantum dot, a quantum rod, or a tetrapod quantum dot. The kinds of the fluorescent materials 472 and 473 may be substantially the same as those described in connection with one or more other embodiments described herein.

The scattering element 474 may include at least one of silica, titanium oxide (TiO2), zirconium oxide (ZrO2), acrylic beads, styrene-acryl beads, melamine beads, polystyrene, polymethylmethacrylate, polyurethane, polycarbonate beads, polyvinyl chloride beads, silicone-based particles, or air pores. The scattering element 474 may have, for example, a hollow shape.

The red fluorescent material absorbs blue light emitted from the organic light emitting element 300 to output red light. The green fluorescent material absorbs blue light emitted from the organic light emitting element 300 to output green light. The scattering element 474 may output blue light emitted from the organic light emitting element 300. The light conversion layer 470 may be provided over an entire surface of the substrate without any additional patterning and may output white light.

In one embodiment, when the organic light emitting element 300 emits white light, the light conversion layer 470 may include a red fluorescent material, a green fluorescent material, and a blue fluorescent material to output white light.

The color filter layer 480 and a black matrix BM may be on the light conversion layer 470. The color filter layer 480 may include a red color filter 480_R, a green color filter 480G, and a blue color filter 480_B.

Components such as the light conversion layer 470, the color filter layer 480, and the like, may be formed on the second substrate 421. The second substrate 421 may include, for example, glass or plastic. In one embodiment, a thin film encapsulating layer, in which a plurality of organic layers and a plurality of inorganic layers are alternately stacked, may be provided instead of the second substrate 421. In addition, a polarization member may be disposed on the second substrate 421 to substantially prevent external light reflection.

Figure 8:
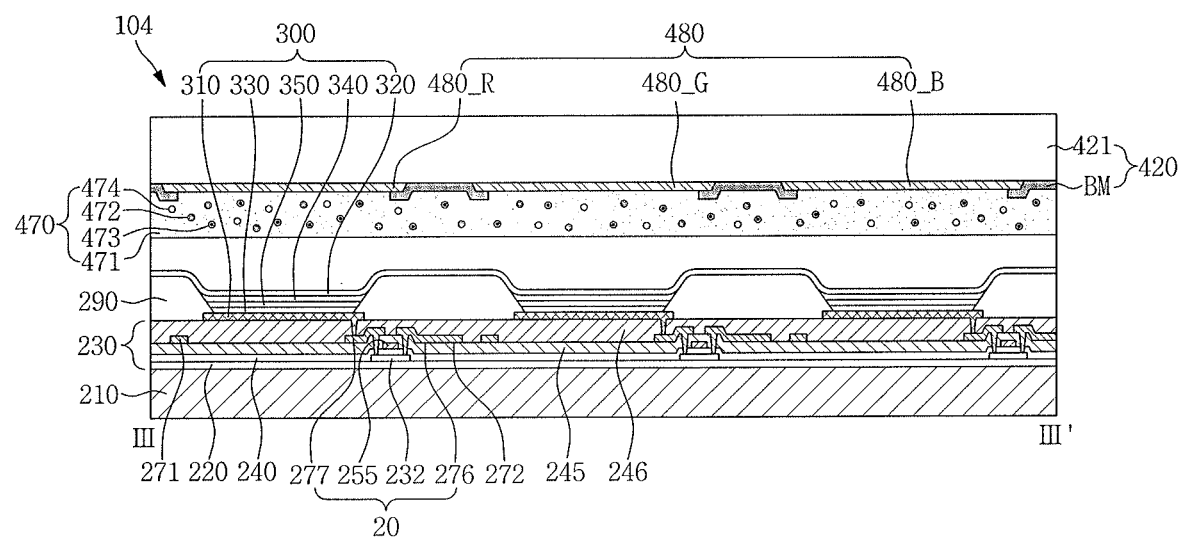
FIG. 8 illustrates another embodiment of a display device.

FIG. 8 illustrates a cross-sectional view of another embodiment of a display device 104. Referring to FIG. 8, an organic light emitting element 300 in the display device 104 may be an organic light emitting element that emits blue light.

The organic light emitting element 300 has a tandem structure in which two light emitting units are connected in series to emit blue light. For example, the organic light emitting element 300 includes a first electrode 310, a second electrode 320 opposing the first electrode 310, a first light emitting unit 330 and a second light emitting unit 340 between the first electrode 310 and the second electrode 320, and an electric charge generation layer 350 between the first light emitting unit 330 and the second light emitting unit 340.

The first light emitting unit 330 and the second light emitting unit 340 may include a blue light emitting layer. For example, the first light emitting unit 330 may include a blue phosphorescent material and the second light emitting unit 340 may include a blue fluorescent material. In one embodiment, the first light emitting unit 330 may include a blue fluorescent material and the second light emitting unit 340 may include a blue phosphorescent material.

When the organic light emitting element 300 emits blue light, the light conversion layer 470 may include a red fluorescent material, a green fluorescent material, and a scattering element to thereby output white light. In one embodiment, the organic light emitting element 300 in the display device 104 may be an organic light emitting element that emits white light.

The organic light emitting element 300 has a tandem structure in which two light emitting units are connected in series to emit white light. For example, the organic light emitting element 300 includes a first electrode 310, a second electrode 320 opposing the first electrode 310, a first light emitting unit 330, and a second light emitting unit 340 between the first electrode 310 and the second electrode 320, and an electric charge generation layer 350 between the first light emitting unit 330 and the second light emitting unit 340.

The first light emitting unit 330 may include a blue light emitting layer and the second light emitting unit 340 may include a yellow light emitting layer. The organic light emitting element 300 may emit white light having a color temperature ranging from, for example, about 6500 K to about 10000 K by adjusting light emission intensity of the blue light emitting layer and the yellow light emitting layer.

In one embodiment, the first light emitting unit 330 may include a yellow light emitting layer and the second light emitting unit 340 may include a blue light emitting layer.

When the organic light emitting element 300 emits white light, the light conversion layer 470 may include a red fluorescent material, a green fluorescent material, and a blue fluorescent material to output white light.

According to one or more of the aforementioned embodiments, by including a light conversion layer, the display device may realize high color reproducibility and improve the viewing angle properties. According to one or more of the aforementioned embodiments, because the display device includes the color filter layer, reflection of external light may be substantially prevented and an additional member for external light reflection may be omitted, thereby reducing costs. According to one or more of the aforementioned embodiments, because the display device does not pattern the light conversion layer, the number of masks may be reduced and fluorescent material such as quantum dots may be substantially prevented from being lost in the manufacturing process.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
a backlight to output light;
a first substrate on a path of the light output from the backlight;
a second substrate facing the first substrate;
a light amount control layer between the first and second substrates;
a pixel electrode on the first substrate;
a color filter layer on the second substrate at a pixel area;
a light conversion layer between the light amount control layer and the color filter layer;
a polarizer between the light amount control layer and the light conversion layer; and
a common electrode between the light amount control layer and the polarizer, the common electrode comprising a transparent conductor,
wherein the light conversion layer and the polarizer are in direct contact,
wherein the light conversion layer is to output white light and is unpatterned, and
wherein the light conversion layer includes:
  a base layer; and
  different kinds of fluorescent materials substantially uniformly dispersed in the base layer,
  the different kinds of fluorescent materials including at least two of a red fluorescent material, a green fluorescent material, or a blue fluorescent material.

2. The display device as claimed in claim 1, wherein the different kinds of fluorescent materials include at least one of a quantum dot, a quantum rod, or a tetrapod quantum dot.

3. The display device as claimed in claim 2, wherein:
the quantum dot has a structure including a shell covering a core,
the core includes at least one of CdSe, CdS, CdTe, ZnS, ZnSe, ZnTe, CdSeTe, CdZnS, CdSeS, PbSe, PbS, PbTe, AgInZnS, HgS, HgSe, HgTe, GaN, GaP, GaAs, InP, InZnP, InGaP, InGaN InAs, or ZnO, and
the shell includes at least one of CdS, CdSe, CdTe, CdO, ZnS, ZnSe, ZnSeS, ZnTe, ZnO, InP, InS, GaP, GaN, GaO, InZnP, InGaP, InGaN, InZnSCdSe, PbS, TiO, SrSe, or HgSe.

4. The display device as claimed in claim 2, wherein the fluorescent material includes at least one of $Y_3Al_5O_{12}:Ce^{3+}$ (YAG:Ce), $Tb_3Al_5O_{12}:Ce^{3+}$ (TAG:Ce), $(Sr, Ba, Ca)_2SiO_4:Eu^{2+}$, $(Sr, Ba, Ca, Mg,Zn)_2Si(OD)_4:Eu^{2+}$ (D=F,Cl,S, N, Br), $Ba_2MgSi_2O_7:Eu^{2+}$, $Ba_2SiO_4:Eu^{2+}$, $Ca_3(Sc,Mg)_2Si3O_{12}:Ce^{3+}$, $(Ca,Sr)S:Eu^{2+}$, $(Sr,Ca)Ga_2S_4:Eu^{2+}$, $SrSi_2O_2N_2:Eu^{2+}$, $SiAlON:Ce^{3+}$, $\beta\text{-}SiAlON:Eu^{2+}$, $Ca\text{-}\alpha\text{-}SiAlON:Eu^{2+}$, $Ba_3Si_6O_{12}N_2:Eu^{2+}$, $CaAlSiN_3:Eu^{2+}$, $(Sr,Ca)AlSiN_3:Eu^{2+}$, $Sr_2Si_5N_8:Eu^{2+}$, $(Sr,Ba)Al_2O_4:Eu^{2+}$, $(Mg,Sr)Al_2O_4:Eu^{2+}$, or $BaMg_2Al_{16}O_{27}:Eu^{2+}$.

5. The display device as claimed in claim 1, wherein the light conversion layer includes a scattering material.

6. The display device as claimed in claim 5, wherein the scattering material includes at least one of silica, titanium oxide ($TiO_2$), zirconium oxide ($ZrO_2$), acrylic beads, styrene-acryl beads, melamine beads, polystyrene, polymethylmethacrylate, polyurethane, polycarbonate beads, polyvinyl chloride beads, silicone-based particles, or air pores.

7. The display device as claimed in claim 5, wherein a particle size of the scattering material is based on the following Equation:

$$\lambda/10 < PS < 2\lambda,$$

where λ corresponds to a center wavelength of light to be emitted by the fluorescent material and PS corresponds to a particle size of the scattering material.

8. The display device as claimed in claim 5, wherein the scattering material has a diameter ranging from about 20 nm to about 1 μm.

9. The display device as claimed in claim 1, wherein the color filter layer includes at least two color filters of different colors.

10. The display device as claimed in claim 9, wherein the light conversion layer is formed integrally with the at least two color filters.

11. The display device as claimed in claim 9, wherein the color filter layer includes a red color filter, a green color filter, and a blue color filter.

12. The display device as claimed in claim 1, wherein the light conversion layer has a thickness ranging from about 1 μm to about 100 μm.

13. The display device as claimed in claim 1, wherein the backlight is to output blue light.

14. The display device as claimed in claim 1, wherein the backlight is to output ultraviolet (UV) light.

15. A display device, comprising:
a first substrate;
an organic light emitter on the first substrate;
a light conversion layer on the organic light emitter; and
a color filter layer on the light conversion layer, the color filter layer comprising at least two color filters, and the light conversion layer being formed integrally with the at least two color filters,
wherein the organic light emitter comprises:
a first electrode which is a pixel electrode;
a light emitting layer on the pixel electrode; and
a second electrode which is a common electrode, on the light emitting layer,
wherein the light conversion layer is to output white light and is unpatterned,
wherein the light emitting layer includes:
a first light emitter; and
an electric charge generation layer on the first light emitter, and
wherein the light conversion layer includes:
a base layer; and
different kinds of fluorescent materials substantially uniformly dispersed in the base layer,
the different kinds of fluorescent materials including at least two of a red fluorescent material, a green fluorescent material, or a blue fluorescent material.

16. The display device as claimed in claim 15, wherein the organic light emitter is to emit blue light.

17. The display device as claimed in claim 16, wherein the light emitting layer includes: a blue light emitting layer.

18. The display device as claimed in claim 15, wherein the organic light emitter is to emit white light.

19. The display device as claimed in claim 18, wherein the light emitting layer further includes:
a second light emitter on the electric charge generation layer,
wherein the first light emitter includes a blue light emitting layer and the second light emitter includes a yellow light emitting layer.

20. The display device as claimed in claim 15, wherein the different kinds of fluorescent materials include at least one of a quantum dot, a quantum rod, or a tetrapod quantum dot.

21. The display device as claimed in claim 20, wherein:
the quantum dot has a structure including a shell covering a core,
the core includes at least one of CdSe, CdS, CdTe, ZnS, ZnSe, ZnTe, CdSeTe, CdZnS, CdSeS, PbSe, PbS, PbTe, AgInZnS, HgS, HgSe, HgTe, GaN, GaP, GaAs, InP, InZnP, InGaP, InGaN, InAs, or ZnO, and
the shell includes at least one of CdS, CdSe, CdTe, CdO, ZnS, ZnSe, ZnSeS, ZnTe, ZnO, InP, InS, GaP, GaN, GaO, InZnP, InGaP, InGaN, InZnSCdSe, PbS, TiO, SrSe, or HgSe.

22. The display device as claimed in claim 20, wherein the different kinds of fluorescent materials include at least one of $Y_3Al_5O_{12}:Ce^{3+}$ (YAG:Ce), $Tb_3Al_5O_{12}:Ce^{3+}$ (TAG:Ce), $(Sr,Ba,Ca)_2SiO_4:Eu^{2+}$, $(Sr,Ba,Ca,Mg,Zn)_2Si(OD)_4:Eu^{2+}$ (D=F, Cl, N Br), $Ba_2MgSi_2O_7:Eu^{2+}$, $Ba_2SiO_4:Eu^{2+}$, $Ca_3(Sc,Mg)_2Si3O_{12}:Ce^{3+}$, $(Ca,Sr)S:Eu^{2+}$, $(Sr,Ca)Ga_2S_4:Eu^{2+}$, $SrSi_2O_2N_2:Eu^{2+}$, $SiAlON:Ce^{3+}$, $β-SiAlON:Eu^{2+}$, $Ca-α-SiAlON:Eu^{2+}$, $Ba_3Si_6O_{12}N_2:Eu^{2+}$, $CaAlSiN_3:Eu^{2+}$, $(Sr,Ca)AlSiN_3:Eu^{2+}$, $Sr_2Si_5N_8:Eu^{2+}$, $(Sr,Ba)Al_2O_4:Eu^{2+}$, $(Mg,Sr)Al_2O_4:Eu^{2+}$, or $BaMg_2Al_{16}O_{27}:Eu^{2+}$.

23. The display device as claimed in claim 15, wherein the light conversion layer includes a scattering material.

24. The display device as claimed in claim 23, wherein the scattering material includes at least one of silica, titanium oxide ($TiO_2$), zirconium oxide ($ZrO_2$), acrylic beads, styrene-acryl beads, melamine beads, polystyrene, polymethylmethacrylate, polyurethane, polycarbonate beads, polyvinyl chloride beads, silicone-based particles, or air pores.

25. The display device as claimed in claim 15, wherein the at least two color filters are of different colors.

* * * * *